United States Patent [19]

Stephens et al.

[11] Patent Number: 5,424,659
[45] Date of Patent: Jun. 13, 1995

[54] MIXED VOLTAGE OUTPUT BUFFER CIRCUIT

[75] Inventors: Geoffrey B. Stephens, Cary; Scott J. Tucker, Raleigh, both of N.C.

[73] Assignee: International Business Machines Corp., Armonk, N.Y.

[21] Appl. No.: 262,207

[22] Filed: Jun. 20, 1994

[51] Int. Cl.$^6$ ............................... H03K 19/094
[52] U.S. Cl. ............................ 326/81; 326/31; 326/58
[58] Field of Search ...................... 326/57–58, 326/80–81, 31; 327/227; 395/325

[56] References Cited

U.S. PATENT DOCUMENTS

| | | | |
|---|---|---|---|
| 4,096,398 | 6/1978 | Khaitan | 307/237 |
| 4,845,388 | 7/1989 | Amatangelo | 307/475 |
| 4,933,648 | 6/1990 | Frogge | 330/288 |
| 4,975,598 | 12/1990 | Borkar | 307/443 |
| 4,975,599 | 12/1990 | Petrovick, Jr, et al. | 307/443 |
| 5,021,684 | 6/1991 | Ahuja et al. | 307/443 |
| 5,111,081 | 5/1992 | Atallah | 307/475 |
| 5,136,182 | 8/1992 | Fawal | 307/450 |
| 5,298,807 | 3/1994 | Salmon et al. | 307/451 X |
| 5,300,835 | 4/1994 | Assar et al. | 307/475 |

OTHER PUBLICATIONS

Article: "A 3.3V ASIC for Mixed Voltage Applications with Shut Down Mode" CICC May 9–May 12. Makoto Ueda et al; IBM Yasu Technology Application Laboratory, Ichimiyake–800, Yasu, Shiga-ken Japan.
Toshiba Semiconductor System Engineering Center, Japan, Article: "Highly Reliable Process Insensitive 3.3V–5V Interface Circuit" Y. Wada, J. Gotoh, H. Takakura, T. Iida, T. Noguchi.

Primary Examiner—David R. Hudspeth
Attorney, Agent, or Firm—Steven B. Phillips

[57] ABSTRACT

A tristate buffer circuit for mixed voltage applications. The circuit is built from field effect transistors and is used as an output buffer in applications where a low voltage component needs to drive both components which are powered by the same low voltage and components which are powered by a higher voltage. The circuit uses a floating n-well technique in combination with a pass-gate network, a one-shot circuit, and a process-dependent bias voltage reference. It is particularly useful on CMOS semiconductor chips which have bus interfaces, such as local area network (LAN) protocol chips.

8 Claims, 5 Drawing Sheets

MIXED VOLTAGE OUTPUT BUFFER CIRCUIT

BACKGROUND

1. Field of the Invention

This invention relates to output buffer circuits. Specifically, the invention relates to tristate buffer circuits for use in mixed voltage applications, where a design requires that a circuit using one supply voltage be able to drive a circuit with a higher supply voltage.

2. Prior Art

Low voltage components are becoming more popular in many card designs because of their lower power consumption and high performance. These low voltage components are typically 3.3 Volt CMOS components, and are integrated onto a single integrated circuit chip. However, often it is desirable to design a system in which a low voltage chip is required to drive readily available, low cost higher supply voltage components. These older chips are typically designed to operate with a 5 Volt power supply as opposed to the 3.3 Volt power supply required to power low voltage CMOS.

Figure 5:
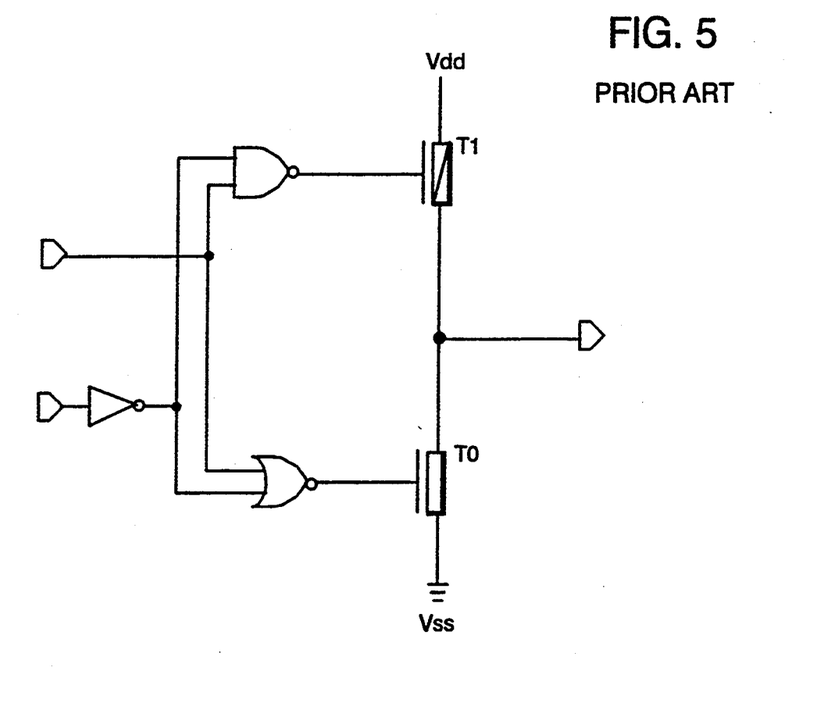
FIG. 5 is a schematic diagram of a prior art output buffer circuit.

A conventional output buffer for a low power 3.3 Volt CMOS integrated circuit chip is shown in FIG. 5. This design includes a standard pull-up, pull-down transistor arrangement which is well-known and used in many buffer circuits. T1 is a normally-off p-channel field effect transistor used as a pull-up transistor, and T0 is a normally-off n-channel field effect transistor used as a pull-down transistor.

Problems occur when a 3.3 volt chip having a buffer circuit like that shown in FIG. 5 is connected to higher voltage components, for example, a 5 volt peripheral transceiver chip. These problems include gate oxide breakdown, hot electron effects, and undesirable reverse leakage currents caused by P/N junctions becoming unintentionally forward biased due to the higher voltage present at the driver output when the 5 Volt transceiver chip input/output is high. All of these problems are well understood in the art. Gate oxide and maximum drain-source voltage protection are commonly achieved with the addition of a series n-channel field effect transistor to the conventional buffer circuit. The reverse leakage problem is discussed below.

One solution to the undesirable leakage current problem requires a depletion device be connected between the output pad and the pull-up PFET. This device prevents the P/N junctions of the PFET from becoming forward biased as the output rises above the 3.3 Volt supply voltage. This solution is described in the publication, *Highly Reliable Process Insensitive 3.3V-5V Interface Circuit*, Y. Wada, J. Gotoh, H. Takakura, T. Iida, and T. Noguchi, Toshiba Semiconductor System Engineering Center, June 1992, which is incorporated herein by reference. Unfortunately, most practical, automated CMOS manufacturing processes do not offer a depletion device.

Another solution involves the use of a "floating n-well" technique. With this technique, a small contention p-channel field effect transistor (PFET) is connected between the gate of the pull-up transistor and the output pad of the circuit. When the driver is tristated and the output is driven above the chip supply voltage (Vdd) by the 5 Volt peripheral, the floating N-well of the pull-up transistor will rise to within a diode drop of the output voltage level. Simultaneously, the contention PFET will pull the gate of the pull-up transistor to the voltage level of the output pad. Both of these actions together stop the reverse flow of current through the buffer circuit into the chip power supply. The floating n-well technique is further described in the article, "A 3.3V ASIC for Mixed Voltage Applications with Shutdown Mode", *Proceedings of the IEEE Customer Integrated Circuits Conference*, M. Ueda et. al., May 1992, which is incorporated herein by reference.

Figure 6:
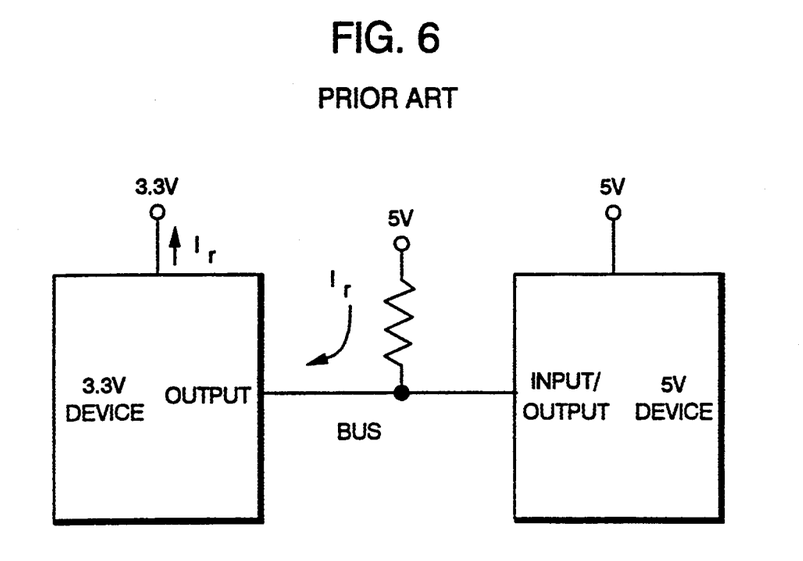
FIG. 6 is a diagram illustrating the reverse leakage current problem of the prior art where a pull-up resistor is used.

One shortcoming of the above approach is that the contention PFET device is biased at chip Vdd and can not turn off the pull-up PFET unless the pull-up current on the 5 Volt chip's bidirectional output buffer can override the current sink capability of the pull-up PFET. Another problem occurs during active mode when a pull-up resistor connected to the 3.3 Volt chip's output pad is terminated to 5 volts. In practice, the termination can be made directly to the 5 volt supply on a mixed voltage circuit card or inside the 5 Volt peripheral chip. When the output pad of the buffer circuit is driven high, the gate of the pull-up transistor is at ground and can never be pulled up to 5 Volts by the contention device. The output of the buffer circuit will always be clamped to Vdd when the output is high, thus allowing reverse current to flow through the pull-up resistor into the chip 3.3 Volt power supply. This situation is illustrated in FIG. 6. The reverse current is labeled Ir. What is needed is a floating n-well design that eliminates leakage current in both the active and tristate modes.

SUMMARY

The present invention solves the problem discussed above through a combination of the floating n-well technique, a pass gate network made up of two PFET's, a one-shot means, and the use of a bias voltage means. The voltage produced by the bias voltage means is dependent on process changes in the PFET threshold voltage and on Vdd, and varies between two values depending on the state of the input of the buffer circuit. The pass gate network prevents the gate of the pull-up PFET from being clamped to ground when a high data input signal is present. The one-shot means responds to the low-to-high transitioning input signal to pull this same gate quickly to ground before releasing it.

The tristate buffer circuit comprises pull-up and pull-down transistors with a voltage limiting impedance disposed in between. The pull-up transistor is a p-channel, n-well type transistor. The well terminal of the pull-up transistor is connected to the well terminals of three additional p-channel, n-well transistors to implement the floating n-well technique. The bias voltage means is connected to the gate terminal of one of the three additional transistors. The circuit also includes a one-shot means and an input means which includes a NAND gate and a NOR gate as found in the input circuits of prior art buffers.

The buffer circuit can be used in any application where it is desirable to drive components powered by the same supply voltage as the buffer circuit and also components powered by a higher voltage. One example is a LAN protocol chip with both local and peripheral bus interfaces. Such a chip is found on LAN adapter cards which are used in microprocessor-based personal computer systems. The buffer circuit allows a driving chip to interface with mixed voltage, bidirectional components in both active and tristate modes without the undesirable reverse leakage currents associated with prior art buffer circuits.

DETAILED DESCRIPTION OF THE PREFERRED EMBODIMENT

Figure 1:
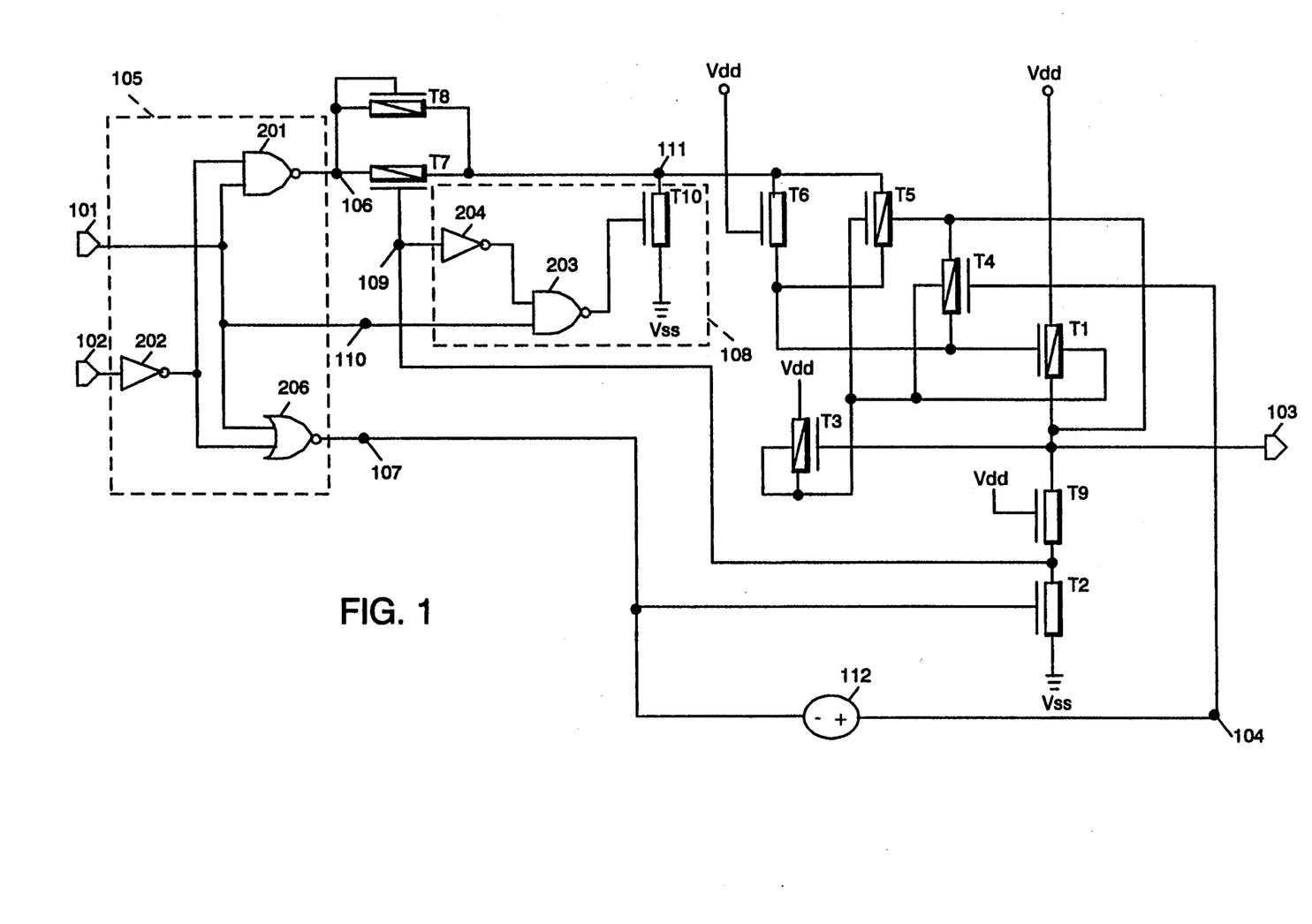
FIG. 1 is a schematic diagram of the circuit of the present invention.

FIG. 1 shows a schematic diagram of the circuit of the present invention. The circuit has an input terminal 101 to which the data is applied, and an enable terminal 102. The circuit operates in a tristate mode, so that when the enable terminal is set to a low signal level, the output buffer circuit is in a high impedance state. The input means 105 is the same as used in tristate circuits of the prior art, consisting of a NAND gate 201, a NOR gate 202, and an invertor 206. The circuit also has an output terminal 103. The circuit is non-inverting.

The circuit has three supply voltage terminals. The points labeled Vdd in FIG. 1 are all connected to a first supply voltage terminal, which is supplied with 3.3 Volts in the preferred embodiment. The points labeled Vss in FIG. 1 are all connected to a second supply voltage terminal, which is 0 Volts or ground in the preferred embodiment. The circuit terminal 104 is a bias voltage input terminal, and a process dependent bias voltage is connected to this terminal. A means for generating this bias voltage will be described later.

The output of the circuit of FIG. 1 is similar to the output used in prior-art buffer circuits. It includes a first field effect transistor T1 which is a normally-off, p-channel transistor which acts as a pull-up transistor. It also includes a normally-off, n-channel transistor T2 which acts as a pull-down transistor. In between the two transistors T1 and T2 is connected means for providing a voltage limiting variable impedance. In the preferred embodiment this means is another n-channel transistor T9, with its gate connected to the first supply voltage, whereby the maximum terminal voltage across T2 is limited to the first supply voltage less the threshold voltage of T2. The output terminal 103 is connected between the transistor T1 and the means for providing a voltage limiting impedance, T9.

As discussed in the "Prior Art" section, the present invention improves on the "floating n-well" technique. The pull-up transistor of the circuit of FIG. 1 is a p-channel, n-well transistor. It is normally fabricated in a well of n-type material diffused into the p-type substrate of an integrated circuit. As is well known in the art, the well of such a transistor has a terminal that must be tied to a high potential in order to keep the well-to-PFET source and drain junctions from becoming forward biased and causing leakage current. It is usually tied to a fixed high potential such as the supply voltage. In the present invention, the well terminals of the p-channel transistors in the output section of the circuit, including the pull-up transistor, are not tied to a fixed potential, but are tied to a potential that changes or "floats" with the operation of the circuit.

The well terminal of T1 is connected to the well and source terminals of transistor T3, which is a p-channel, normally-off field effect transistor. The well terminals of both T1 and T3 are further connected to the well terminals of fourth and fifth transistors T4 and T5. T4 and T5 are also p-channel, normally-off, field effect transistors. T3 and T5 are both gated by (have their gate terminals connected to) the circuit output terminal 103 which is also connected to the source terminal of T4. T4 is gated by the bias voltage input terminal 104, which is connected to a means for providing a bias voltage 112. The means for providing a bias voltage 112 in the preferred embodiment is a bias voltage reference designed so that a voltage determined by the process dependent value of the PFET threshold is produced when the output of the circuit of FIG. 1 driven high. The bias voltage reference will be discussed in more detail below.

The source terminal of T5 is connected to the output terminal 111 of a one-shot circuit 108. The source terminal of T5 is connected to the gate terminal of T1, and the source terminal of T4. A normally-off, n-channel, field effect transistor T6 is disposed in parallel with T5 and is gated by the first supply voltage terminal.

The one-shot circuit 108 has a first input terminal 109 connected to a point between transistors T2 and T9, and a second input terminal 110 connected to the circuit input terminal 101. In the preferred embodiment, the one-shot circuit consists of a NAND gate 203, an invertor 204, and an n-channel transistor T10. The output of the one-shot circuit is the drain terminal of the transistor T10. The design and operation of a one-shot circuit of this type is well understood in the art. The one-shot circuit is triggered by the rising edge of the waveform at the input terminal 101. Transistor T10 pulls terminal 111 to ground potential until terminal 109 follows the rising output terminal 103 and resets the one-shot. Terminal 111 is driven near ground potential but is not clamped to ground by T10.

The input means 105 has a first input means signal terminal 106 and a second input means signal terminal 107. The second input means signal terminal 107 gates the pull-down transistor T2 and is also connected to the bias voltage means 112. The first input means signal terminal 106 supplies an inverted version of the input signal to the pull-up transistor only when the circuit is enabled, and essentially drives the pull-up transistor T1 through transistors T5 and T6. The second input means terminal 107 supplies an inverted version of the input data signal when the circuit is enabled and drives the pull-down transistor T2.

As stated above, the first input means signal terminal 106 supplies an inverted version of the input signal at the circuit input terminal 101 to the pull-up transistor of the circuit when the circuit is enabled. When the circuit is disabled, the first input means signal terminal 106 is high. The first input means signal terminal 106 does not drive the rest of the circuit directly. Instead, field effect transistors T7 and T8 are disposed in parallel between the first input means signal terminal 106 and the drain terminal of transistor T5 and source terminal of T6. The gate terminal of transistor T7 is connected to the first input terminal 109 of the one-shot means, and the gate terminal of transistor T8 is connected to the first input means signal terminal 106. Transistors T7 and T8 are normally-off, p-channel transistors.

It should be noted that not all of the transistors of FIG. 1 have well terminal connections shown. The connections not shown are understood to be for normal operation, which is to a high potential for p-channel, n-well transistors, and a low potential for n-channel, p-well transistors. These connections are readily understood by anyone of ordinary skill in the circuit design art and therefore have been omitted for simplicity.

The circuit of FIG. 1 operates using a combination of the floating n-well technique discussed earlier, a pass-gate network, a one-shot circuit, and the input of a bias voltage at the bias voltage input terminal 104. When the output of the circuit is high, the bias voltage input terminal 104 is supplied with a voltage equal to Vdd minus one PFET threshold voltage (Vtp). When the output of the circuit is low, the bias voltage input terminal is supplied with the first supply voltage Vdd.

Transistor T9 reduces the gate-to-drain voltage, and the drain-to-source voltage of T2, protecting it from gate oxide breakdown and hot electron effects when the output voltage at terminal 103 is pulled above the first supply voltage Vdd by a higher voltage device being driven by the circuit of FIG. 1. In tristate mode, terminal 106 biases the gate of T1 at the first supply voltage Vdd through transistor T7, if the output terminal 103 is below Vdd. As the output terminal 103 is pulled above Vdd by the device being driven, transistor T7 ceases to conduct and transistor T4 conducts because it's gate is biased at Vdd−Vtp by the bias voltage supplied to terminal 104 by the bias voltage means 112. In this case, transistor T4 pulls the gate terminal of transistor T1 to the voltage level of the output terminal 103. Thus, transistor T1 is completely shut off and no current can flow backwards from the output terminal 103 to the first supply voltage terminal Vdd.

Transistors T7 and T8 form a pass-gate network which is important for active mode operation. When the circuit output terminal 103 is driven high, transistor T7 is biased no higher than one NFET threshold below the first supply voltage Vdd. Consequently, transistor T7 keeps the gate terminal of transistor T1 from being clamped to ground, by NAND gate 201. If a pull-up resistor terminated to a higher supply voltage tries to pull the output terminal 103 of the output buffer circuit above Vdd, transistor T4 pulls up the gate terminal of transistor T1, turning transistor T1 off and preventing reverse current from flowing into the first supply voltage terminal Vdd. Since the circuit must also be able to maintain a minimum up-level voltage, transistor T8 is included to insure that transistor T1 can maintain this up-level voltage while sourcing current. In the preferred embodiment with Vdd at 3.3 Volts, the required minimum up-level voltage is 2.7 Volts. Transistor T8 provides a small leakage path to prevent the gate terminal of the pull-up transistor T1 from floating too high above the second supply voltage Vss (ground) and prematurely turning transistor T1 off.

Figure 2:
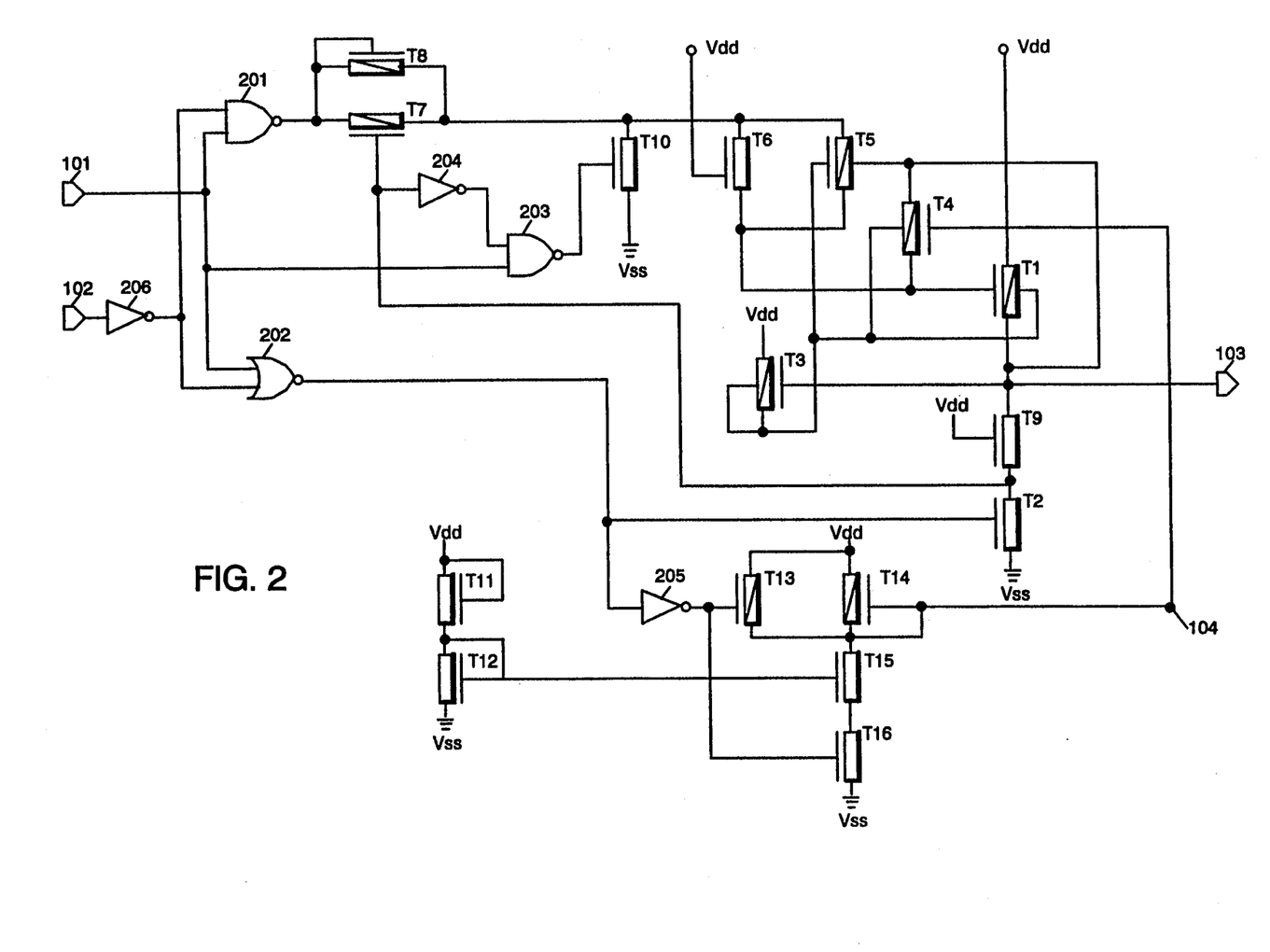
FIG. 2 is a detailed schematic diagram of the preferred embodiment of the circuit of the present invention, showing the design of the bias voltage circuit.

The circuit of FIG. 2 is the same as the circuit of FIG. 1 except that the design details of bias voltage means 112 in the preferred embodiment are shown. Transistors T11 and T12 form a current mirror. Invertor 205 inverts the signal from NAND gate 202, thus gating transistor T13 with a voltage waveform essentially identical to the waveform at the input terminal 101. When the output terminal 103 is driven high by the input terminal 101, the voltage reference output terminal 104 provides a voltage approximately equal to Vdd−Vtp. This voltage is a result of the voltage drop across the diode-connected, active resistor T14. If the current produced by the current mirror made up of T11, T12, and T15 is relatively constant and very small, and the width to length ratio of T14 is large, this drop should be equal to the process dependent threshold voltage of PFET T14. The thresholds of PFET's T4 and T14 should track together so that contention device T4 can properly turn off device T1 when the output terminal is either driven or passively pulled above Vdd by a peripheral component.

When the output terminal 103 is driven low by the input terminal 101, PFET device T13 is activated and pulls the voltage reference output terminal to Vdd to insure that PFET T14 is off. NFET device T16 is turned off so that no direct current flows through devices T13, T15, and T16.

Figure 3:
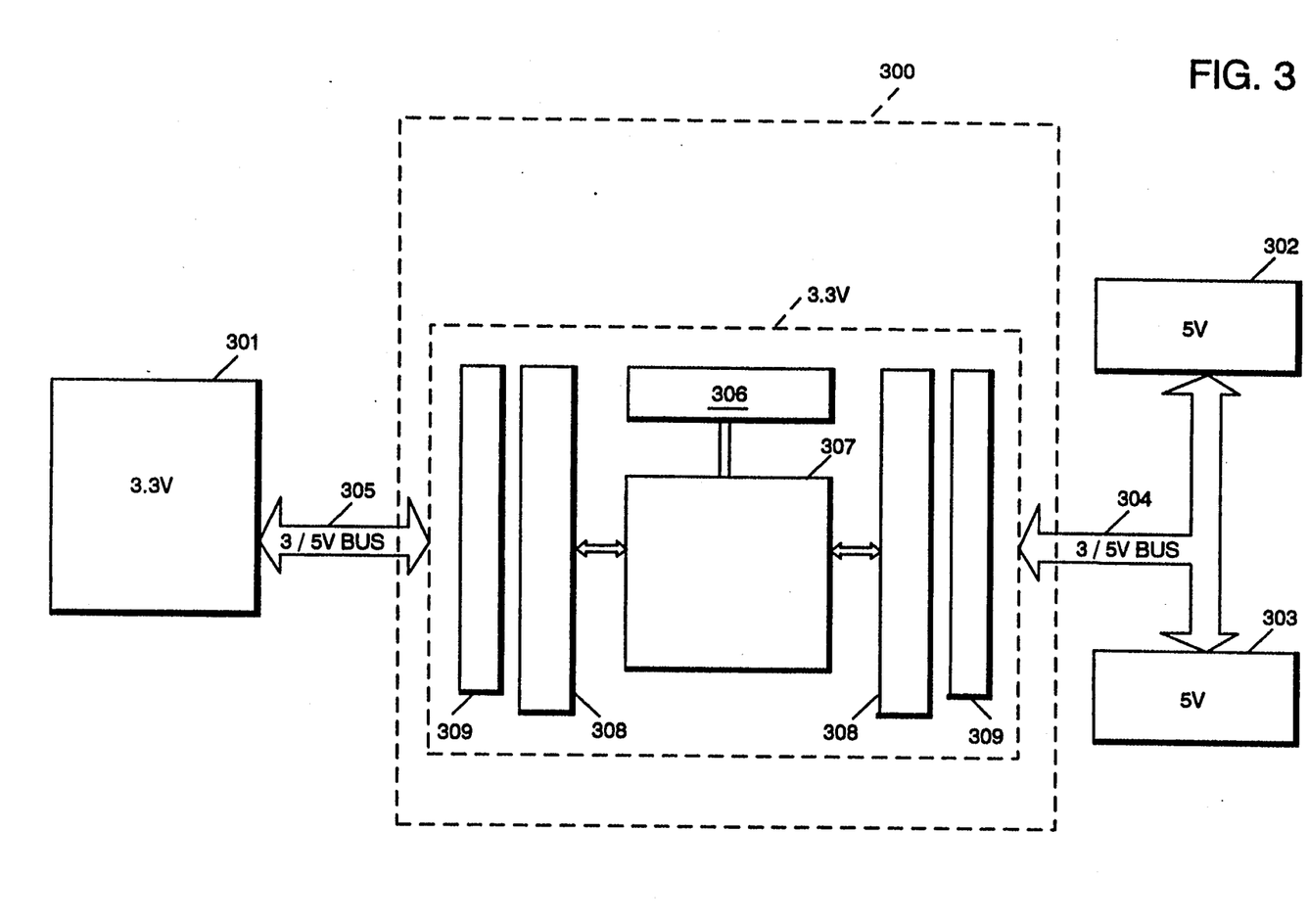
FIG. 3 is a block diagram of a semiconductor chip in which the circuit of the present invention finds use, and the environment in which the chip is used.

FIG. 3 shows the details of an integrated circuit chip 300 and the environment in which the buffer circuit of the present invention is used. It should be emphasized that the buffer circuit of the present invention as shown in FIG. 1 and FIG. 2 is a general purpose circuit that finds many uses. However, the chip 300 of FIG. 3 is a local area network (LAN) protocol chip such as that used in token ring LAN adapter cards. The chip is constructed of low power CMOS circuitry powered by 3.3 Volts. The chip is controlled by the microprocessor 306. Circuitry for LAN signalling and control 307 is connected to the microprocessor and sends and receives signals on the LAN. The LAN and the connections between the LAN and the circuitry 307 are omitted for simplicity. The chip contains two sets of bus interface circuitry 308. One set is for interfacing to a local bus and the other set is for interfacing to a peripheral bus. The peripheral bus is shown at 305 and drives low voltage components 301 which in the preferred embodiment are 3.3 Volt components. The local bus is shown at 304 and drives two sets of high voltage components 302 and 303 which in the preferred embodiment are 5 Volt components. The circuits of FIG. 1 are disposed at 309 one for each signal, and all the circuits are identical.

FIG. 3 illustrates a principle advantage of the circuit of the present invention. All of the buffer circuits 309 are identical, thus making the design of the chip 300 simple. Yet the circuits can power either components using the same supply voltage as chip 300 or higher voltage components without any of the ill effects of prior art buffer circuit designs.

Figure 4:
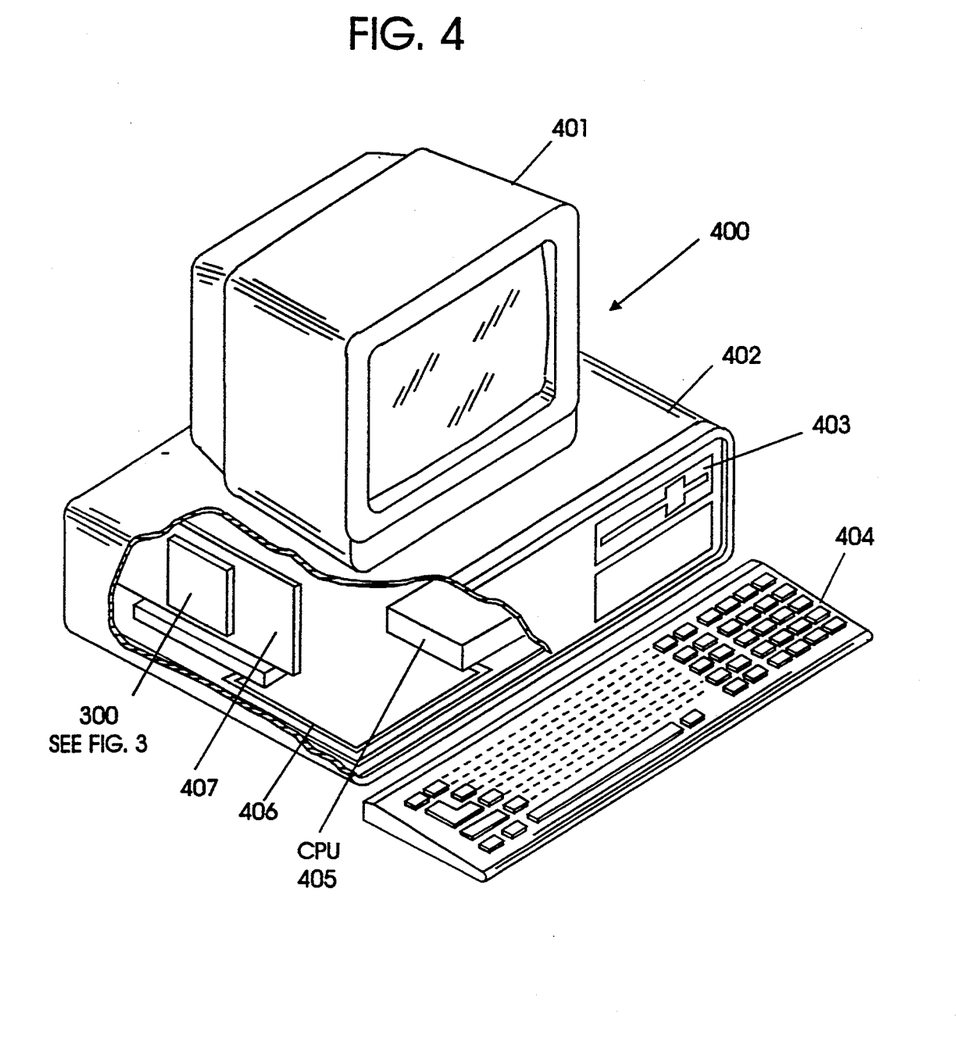
FIG. 4 is a drawing of a computer system in which a semiconductor chip embodying the circuit of the present invention finds use.

FIG. 4 shows a specific implementation of the present invention, on the chip of FIG. 3 within a microprocessor based computer system 400. System 400 includes display 401, disk storage means 403, and keyboard 404. Chassis 402 encloses various computer hardware (not shown) typical of microprocessor-based computing systems. Within chassis 402, the central processor unit (CPU) 405 is coupled via bus 406 to one or more peripheral adapters which comprise one or more adapter cards 407. An adapter card 407 includes chip 300 of FIG. 3 which includes the circuitry of the present invention, and allows the computer system 400 to communicate with a LAN connected to the adapter card 407.

While the present invention has been described in an environment consisting of a CMOS LAN protocol chip in a traditional desk-top computer system adapter, it should be noted that the buffer circuit of the present invention is a general purpose circuit. It can be used on any kind of semiconductor chip which must interface to mixed voltage components. Such a chip could be on an adapter in a traditional desk-top computer system, or in a miniature adapter in a portable computer system, or on a "mother-board" within either of the above.

We claim:

1. A buffer circuit for mixed voltage applications, the circuit comprising:

a circuit input terminal;

an enable terminal;

a first supply voltage terminal for connection to a first supply voltage;

a second supply voltage terminal;

an output terminal;

a bias voltage input terminal for receiving a process-dependent bias voltage;

first and second field effect transistors disposed in series between the first and second supply voltage terminals and having the output terminal connected to a point between the two transistors, the first transistor having a gate terminal and a well terminal and being of the normally-off p-channel type, the second transistor having a gate terminal and being of the normally-off n-channel type;

means for providing a voltage limiting impedance disposed between the second field effect transistor and the point where the output terminal is connected;

third, fourth and fifth field effect transistors, each of the p-channel normally-off type, each having a well terminal, a gate terminal, a source terminal, and a drain terminal, the well terminals of all three connected together, to the drain terminal of the third field effect transistor, and connected to the well of the first field effect transistor, the source terminal of the third field effect transistor connected to the first supply voltage terminal, the gate terminals of the third and fifth field effect transistors connected together and to the output terminal and the drain terminal of the fourth field effect transistor, the gate of the fourth field effect transistor connected to the bias voltage input terminal;

a sixth field effect transistor of the normally-off n-channel type having a gate connected to the first supply voltage terminal, a source connected to the drain of the fifth field effect transistor, and a drain connected to the drain of the fourth field effect transistor and the gate of the first field effect transistor;

input means connected to the circuit input and enable terminals and having first and second input means signal terminals, the second input means signal terminal connected to the gate of the second field effect transistor;

one-shot means having first and second input terminals and an output terminal, the second input terminal connected to the circuit input terminal, the output terminal connected to the source of the sixth field effect transistor; and pass gate means including seventh and eighth field effect transistors disposed in parallel between the output terminal of the one-shot means and the first input means signal terminal, the eighth field effect transistor having a gate terminal connected to the first input means signal terminal and the seventh field effect transistor having a gate terminal connected to the first input terminal of the one-shot means and to a point between the second field effect transistor and the means for providing a voltage limiting impedance.

2. The buffer circuit of claim 1 wherein the means for providing a voltage limiting impedance comprises an n-channel, normally-off field effect transistor having a gate terminal connected to the first supply voltage terminal.

3. The buffer circuit according to claims 1 or 2 further comprising:

means for providing a bias voltage, the means having an input connected to the second input means signal terminal and an output connected to the bias voltage input terminal, the bias voltage varying between the value of the first supply voltage and a value equal to the first supply voltage minus a p-channel threshold voltage.

4. A local area network (LAN) protocol integrated circuit chip comprising:

a first supply voltage terminal for connection to a first supply voltage;

a second supply voltage terminal;

a microprocessor;

bus interface circuitry;

circuitry for LAN signalling and control disposed between the microprocessor and the bus interface circuitry; and one or more buffer circuits connected to the bus interface circuitry, each buffer circuit including:

a circuit input terminal;

an enable terminal;

an output terminal connected to a bus;

a bias voltage input terminal for receiving a process-dependent bias voltage;

first and second field effect transistors disposed in series between the first and second supply voltage terminals and having the output terminal connected to a point between the two transistors, the first transistor having a gate terminal and a well terminal and being of the normally-off p-channel type, the second transistor having a gate terminal and being of the normally-off n-channel type;

means for providing a voltage limiting impedance disposed between the second field effect transistor and the point where the output terminal is connected;

third, fourth and fifth field effect transistors, each of the p-channel normally-off type, each having a well terminal, a gate terminal, a source terminal, and a drain terminal, the well terminals of all three connected together, to the drain terminal of the third field effect transistor, and connected to the well of the first field effect transistor, the source of the third field effect transistor connected to the first supply voltage terminal, the gate terminals of the third and fifth field effect transistors connected together and to the output terminal and the drain terminal of the fourth field effect transistor, the gate of the fourth field effect transistor connected to the bias voltage input terminal;

a sixth field effect transistor of the normally-off n-channel type having a gate connected to the first supply voltage terminal, a source connected to the drain of the fifth field effect transistor, and a drain connected to the drain of the fourth field effect transistor and the gate of the first field effect transistor;

input means connected to the circuit input and enable terminals and having first and second input means signal terminals, the second input means signal terminal connected to the gate of the second field effect transistor;

one-shot means having first and second input terminals and an output terminal, the second input terminal connected to the circuit input terminal, the output terminal connected to the source of the sixth field effect transistor; and pass-gate means including seventh and eighth field effect transistors disposed in parallel between the output terminal of the one-shot means and the first input means signal terminal, the eighth field effect transistor having a gate terminal connected to the first input means signal terminal and the seventh field effect transistor having a gate terminal connected to the first input terminal of the one-shot means and to a point between the second field effect transistor and the means for providing a voltage limiting impedance.

5. The integrated circuit chip of claim 4 wherein each means for providing a voltage limiting impedance comprises an n-channel, normally-off field effect transistor having a gate terminal connected to the first supply voltage terminal.

6. The integrated circuit chip according to claims 4 or 5, each buffer circuit further comprising:

means for providing a bias voltage, the means having an input connected to the second input means signal terminal and an output connected to the bias voltage input terminal, the bias voltage varying between the value of the first supply voltage and a value equal to the first supply voltage minus a p-channel threshold voltage.

7. An adapter card for use within a computer system, the adapter card comprising:

one or more local area network (LAN) protocol integrated circuit chips, each including:

a first supply voltage terminal for connection to a first supply voltage;

a second supply voltage terminal;

a microprocessor;

bus interface circuitry;

circuitry for LAN signalling and control disposed between the microprocessor and the bus interface circuitry; and one or more buffer circuits connected to the bus interface circuitry, each buffer circuit comprising:

a circuit input terminal;

an enable terminal;

an output terminal connected to a bus;

a bias voltage input terminal for receiving a process-dependent bias voltage;

first and second field effect transistors disposed in series between the first and second supply voltage terminals and having the output terminal connected to a point between the two transistors, the first transistor having a gate terminal and a well terminal and being of the normally-off p-channel type, the second transistor having a gate terminal and being of the normally-off n-channel type;

means for providing a voltage limiting impedance disposed between the second field effect transistor and the point where the output terminal is connected;

third, fourth and fifth field effect transistors, each of the p-channel normally-off type, each having a well terminal, a gate terminal, a source terminal, and a drain terminal, the well terminals of all three connected together, to the drain terminal of the third field effect transistor, and connected to the well of the first field effect transistor, the source of the third field effect transistor connected to the first supply voltage terminal, the gate terminals of the third and fifth field effect transistors connected together and to the output terminal and the drain terminal of the fourth field effect transistor, the gate of the fourth field effect transistor connected to the bias voltage input terminal;

a sixth field effect transistor of the normally-off n-channel type having a gate connected to the first supply voltage terminal, a source connected to the drain of the fifth field effect transistor, and a drain connected to the drain of the fourth field effect transistor and the gate of the first field effect transistor;

input means connected to the circuit input and enable terminals and having first and second input means signal terminals, the second input means signal terminal connected to the gate of the second field effect transistor;

one-shot means having first and second input terminals and an output terminal, the second input terminal connected to the circuit input terminal, the output terminal connected to the source of the sixth field effect transistor; and pass-gate means including seventh and eighth field effect transistors disposed in parallel between the output terminal of the one-shot means and the first input means signal terminal, the eighth field effect transistor having a gate terminal connected to the first input means signal terminal and the seventh field effect transistor having a gate terminal connected to the first input terminal of the one-shot means and to a point between the second field effect transistor and the means for providing a voltage limiting impedance.

8. A computer system comprising:

a central processing unit (CPU);

a storage means;

a bus coupling the central processing unit and the storage means to one or more adapter card connectors for transmission of control information and data between the processor, the storage means, and the adapter card connectors; and one or more adapter cards, each adapter card including:

one or more local area network (LAN) protocol integrated circuit chips, each chip including a first supply voltage terminal for connection to a first supply voltage, a second supply voltage terminal, a microprocessor, bus interface circuitry, local area network (LAN) signalling and control circuitry, and one or more buffer circuits, each buffer circuit comprising:

a circuit input terminal;

an enable terminal;

an output terminal connected to a bus;

a bias voltage input terminal for receiving a process-dependent bias voltage;

first and second field effect transistors disposed in series between the first and second supply voltage terminals and having the output terminal connected to a point between the two transistors, the first transistor having a gate terminal and a well terminal and being of the normally-off p-channel type, the second transistor having a gate terminal and being of the normally-off n-channel type;

means for providing a voltage limiting impedance disposed between the second field effect transistor and the point where the output terminal is connected;

third, fourth and fifth field effect transistors, each of the p-channel normally-off type, each having a well terminal, a gate terminal, a source terminal, and a drain terminal, the well terminals of all three connected together, to the drain terminal of the third field effect transistor, and connected to the well of the first field effect transistor, the source of the third field effect transistor connected to the first supply voltage terminal, the gate terminals of the third and fifth field effect transistors connected together and to the output terminal and the drain terminal of the fourth field effect transistor, the gate of the fourth field effect transistor connected to the bias voltage input terminal;

a sixth field effect transistor of the normally-off n-channel type having a gate connected to the first supply voltage terminal, a source connected to the drain of the fifth field effect transistor, and a drain connected to the drain of the fourth field effect transistor and the gate of the first field effect transistor;

input means connected to the circuit input and enable terminals and having first and second input means signal terminals, the second input means signal terminal connected to the gate of the second field effect transistor;

one-shot means having first and second input terminals and an output terminal, the second input terminal connected to the circuit input terminal, the output terminal connected to the source of the sixth field effect transistor; and pass-gate means including seventh and eighth field effect transistors disposed in parallel between the output terminal of the one-shot means and the first input means signal terminal, the eighth field effect transistor having a gate terminal connected to the first input means signal terminal and the seventh field effect transistor having a gate terminal connected to the first input terminal of the one-shot means and to a point between the second field effect transistor and the means for providing a voltage limiting impedance.

* * * * *